United States Patent [19]
Narayanan et al.

[11] Patent Number: 5,898,702
[45] Date of Patent: Apr. 27, 1999

[54] MUTUAL EXCLUSIVITY CIRCUIT FOR USE IN TEST PATTERN APPLICATION SCAN ARCHITECTURE CIRCUITS

[75] Inventors: Sridhar Narayanan, Cupertino; Marc E. Levitt, Sunnyvale, both of Calif.

[73] Assignee: Sun Microsystems, Inc., Palo Alto, Calif.

[21] Appl. No.: 08/867,892

[22] Filed: Jun. 3, 1997

[51] Int. Cl.[6] .................................................. G01R 31/28
[52] U.S. Cl. ...................................... 371/22.31; 371/22.36
[58] Field of Search ............................ 371/22.1, 22.31, 371/22.32, 22.33, 22.34, 22.5, 22.6, 27.1; 395/183.09, 182.13; 364/489, 488, 491

[56] References Cited

U.S. PATENT DOCUMENTS

| | | | |
|---|---|---|---|
| 5,574,853 | 11/1996 | Barch et al. | 371/22.31 |
| 5,661,407 | 8/1997 | Shibata | 371/22.31 |
| 5,684,808 | 11/1997 | Valind | 364/489 |
| 5,774,708 | 6/1998 | Klingler | 371/22.31 |

*Primary Examiner*—Trinh L. Tu
*Attorney, Agent, or Firm*—The Law Offices of Bever & Hoffman, LLP

[57] ABSTRACT

A circuit for locally ensuring mutual exclusivity of selected signals during scan testing is coupled between an IEEE 1149.1 TAP controller and a conventional gating circuit. The mutual exclusivity circuit includes an AND-gate, an inverter, a first scan flip-flop and a second scan flip-flop. The first and second flip-flops have their scan-input leads hardwired to receive logic "1" and logic "0" signals, respectively. The first flip-flop also has its data input lead hardwired to receive a logic "0" signal. During the scan mode, the AND-gate receives a conventional rst_tri_en signal from the TAP controller. Thus, the AND-gate outputs a local_rst_tri_en signal identical to the rst_tri_en signal. After the test pattern is scanned in, the rst_tri_en signal transitions to a logic "1" level, causing the local_rst_tri_en signal to transition to a logic high level, which allows the test pattern to propagate through the circuit under test. At the leading edge of the capture pulse, the circuit enters the normal functional mode in which the second flip-flop stores and outputs the logic "1" signal outputted by the first flip-flop. After the propagation delay from the second flip-flop and the inverter, this logic "1" signal is inverted, causing the AND-gate to output the local_rst_tri_en signal at a logic "0" level. This propagation delay is predetermined to allow the response data to be captured in the scan chain without damaging the circuit device requiring mutually exclusive signals, thereby removing the response data constraint on the test pattern.

15 Claims, 3 Drawing Sheets

MUTUAL EXCLUSIVITY CIRCUIT FOR USE IN TEST PATTERN APPLICATION SCAN ARCHITECTURE CIRCUITS

FIELD OF THE INVENTION

The present invention is related to test circuitry and, more particularly, to scan design test circuitry and test pattern generation.

BACKGROUND

Many high-speed applications such as, for example, microprocessors, use circuit devices that require mutually exclusive signals. For example, decoded multiplexers are commonly used in high-speed microprocessors and, as is well known in the art of microprocessor design, require mutually exclusive select signals. In normal functional operation, only one of the mutually exclusive signals in such a circuit is asserted at any given time, with the rest of the mutually exclusive signals being deasserted. By enabling only one mutually exclusive signal at a time, the circuit device avoids high current conditions in the circuit device. These high current conditions can damage or "burnout" the circuit device as well as result in the circuit device outputting an undefined signal.

FIG. 1 is a block diagram illustrating a small part of a circuit 100 including a conventional decoded multiplexer 101 that is adapted for scan design testing. In particular, the multiplexer 101 has a first select lead 103 connected to receive a select signal s0. The multiplexer 101 also includes a second select lead 105 connected to receive a select signal s. Because the multiplexer 101 is decoded, the select signals s0 and s1 must be mutually exclusive to prevent damage to the multiplexer 101. In this example, the select signals s0 and s1 are provided through scan flip-flops (FF) $107_N$ and $107_{N-1}$, that form part of a conventional scan chain 107. In a scan mode, the scan chain 107 can be serially loaded with test patterns to test the circuit 100 using well known scan design techniques. The test patterns are typically generated using an automatic test pattern generation (ATPG) software tool, which are well known in the art of test circuits. In particular, each of the flip-flops forming the scan chain 107 has a scan-in (si) lead connected to a scan-out (so) lead of the preceding flip-flop in the scan chain 107. In effect, the scan chain 107 resembles a large shift register. It will be appreciated that scan enable (se), clock and data lines interconnect the flip-flops 107 with other logic circuitry (not shown) of the circuit 100, which are omitted for clarity.

The circuit 100 is tested using scan design techniques well known in the art of test circuits. In a typical scan design scheme, a circuit is tested by: (a) configuring the circuit into a scan mode and "scanning in" a test pattern into the circuit's scan chain; (b) configuring the circuit into a normal functional mode and allowing the test pattern to propagate through the logic circuitry of the circuit; (c) pulsing the circuit and capturing the response in the scan chain; (d) configuring the circuit into the scan mode and "scanning out" the captured data from the scan chain for comparison with the expected values.

During the scan mode as the test pattern is scanned in or applied to the circuit 100, the test pattern may cause the flip-flops $107_N$ and $107_{N-1}$ to have values that violate the mutual exclusivity requirements of the multiplexer 101 regarding the select signals s0 and s1. The multiplexer 101 may be damaged as described above due to a high current condition caused by this violation of the mutual exclusivity requirement. One conventional solution is to constrain the ATPG software tool used to generate the test patterns to avoid patterns that violate the mutual exclusivity requirement of the multiplexer 101 (and, of course, every other circuit device in the circuit 100 that has a mutual exclusivity requirement). As a result, the complexity, computation time, and cost of the test pattern generation are typically relatively high. In addition, the constraints may result in poor fault coverage of the circuit 100.

Moreover, the response of the circuit 100 to the test patterns captured by the scan chain 107 may also violate the mutual exclusivity requirement of the multiplexer 101 either directly or as the capture data is scanned out of the scan chain 107. Consequently, the ATPG software tool must be further constrained to generate test patterns that cause the circuit 100 to respond with capture data that complies with the mutual exclusivity requirements of the multiplexer 101. Of course, the ATPG software tool is similarly constrained to avoid violating the mutual exclusivity requirements (if any) of every other circuit device in the circuit 100. These two constraints cause a significant increase in the complexity, computation time and cost of test pattern generation, and typically reduce the fault coverage of the test patterns.

FIG. 2 shows a block diagram of a portion of a circuit 200 implementing a typical conventional solution to the above problem. The circuit 200 is substantially similar to the circuit 100 (FIG. 1) except that the circuit 200 includes a gating circuit 201 coupling the flip-flops $107_N$ and $107_{N-1}$ to the multiplexer 101. The circuit 200 has a similar gating circuit for each circuit device requiring mutually exclusive signals.

More specifically, in this conventional solution the select leads 103 and 105 of the multiplexer 101 are connected to the gating circuit 201 rather than directly to the flip-flops $107_N$ and $107_{-1}$. The gating circuit 201 is also connected to receive a signal rst_tri_en via a line 203. The rst_tri_en signal is a "global" signal (i.e., a signal provided to the gating circuits of all of the circuit devices with mutual exclusivity requirements) typically provided by a conventional Reset block or test access port (TAP) controller. In particular, TAP controllers are defined in "The IEEE Standard Test Access Port and Boundary Scan Architecture, IEEE Standard 1149.1-1990", which is incorporated herein by reference. Such TAP controllers and Reset blocks are well known in the art of test circuits.

The gating circuit 201 functions to gate the signals from the flip-flops $107_N$ and $107_{N-1}$ to the select leads 103 and 105 of the multiplexer 101 only during the normal operation mode. The gating circuit 201 operates to force the signals on the select leads 103 and 105 to predetermined mutually exclusive logic levels. Thus, while test patterns are being scanned into the scan chain 107, the gating circuit 201 prevents the test pattern from propagating to the multiplexer 101. Accordingly, the test pattern need not be constrained to comply with the mutual exclusivity requirements of the select signals s0 and s1 during the scan in phase. Although the test pattern, when finally scanned in, does have to meet the mutual exclusivity requirements of the select signals s0 and s1. In addition, as described below in conjunction with FIGS. 3 and 4, the gating circuit 201 does not address the response constraint.

FIG. 3 is a circuit diagram of a conventional gating circuit 201. In this example, the gating circuit 201 includes a two-input OR-gate 301 and a two-input AND-gate 303. The OR-gate 301 has an inverting input lead connected to receive the rst_tri_en signal. The other input lead of the OR-gate 301 is connected to the output lead 305 of the flip-flop 107$_N$. The AND-gate 303 has one input lead connected to receive the rst_tri_en signal while its other input lead is connected to the output lead 307 of the flip-flop 107$_{N-1}$. The rst_tri_en signal is generated to have a logic high level during the normal functional mode and to have a logic low level during the scan mode.

When the rst_tri_en signal is at a logic low level, the inverting input lead of the OR-gate 301 forces the OR-gate 301 to output the select signal s1 at a logic high level onto the select lead 105. The logic low level of the rst_tri_en signal also forces the AND-gate 303 to output the select signal s0 at a logic low level onto the select lead 103. The gating circuit 201, by forcing the select signals s0 and si to respectively have logic low and logic high levels, ensures that the select signals are mutually exclusive during the scan mode.

Conversely, when the rst_tri_en signal is at a logic high level, the inverting input lead of the OR-gate 301 allows the OR-gate 301 to output onto the select lead 105 the signal s1 with a logic level equivalent to the stored logic level of the flip-flop 107$_N$ received through the lead 305. The logic high level of the rst_tri_en signal also allows the AND-gate 303 to output onto the select lead 103 the signal s0 with a logic level equivalent to the stored logic level of the flip-flop 107$_{N-1}$ received through the lead 307. Accordingly, the gating circuit 201, in effect, isolates the flip-flops 107$_N$ and 107$_{N-1}$ from the multiplexer 101 (FIG. 2) during the scan mode and propagates the stored signals in the flip-flops to the multiplexer 101 during the normal mode.

In particular, the flip-flops in the scan chain 107 (FIG. 2) receive the clock signal CK illustrated in the timing diagram of FIG. 4. In the first portion of the timing diagram, the circuit 200 is configured to scan in the test pattern. More specifically, the circuit 200 is configured in the scan mode as indicated by the scan enable signal se being asserted (i.e., at a logic high level) and the rst_tri_en signal being deasserted (i.e., at a logic low level).

After the test pattern is scanned in, the circuit 200 is configured into the normal mode and the next clock cycle is used to load the response data into the scan chain 107. More specifically, just prior to the rising edge of the capture pulse CP, the scan enable signal se is deasserted and the rst_tri_en signal is asserted, configuring the scan chain 107 into the normal mode. In the normal mode, the circuit 200 operates on the test pattern stored in the scan chain, including the pattern stored in the flip-flops 107$_N$ and 107$_{N-1}$ and propagated to the logic circuitry through the gating circuit 201.

For example, as shown in FIG. 5, the test pattern loaded in the scan chain 107, can include flip-flops 107$_M$ and 107$_{M+1}$ that cause logic circuitry 501 to generate logic signals that are received by the flip-flops 107$_N$ and 107$_{N-1}$. Then the leading edge of the capture pulse CP (FIG. 4) causes the flip-flops 107$_N$ and 107$_{N-1}$ to store the logic levels of these received signals, that are then provided to the gating circuit 201. However, because the capture pulse CP is a "normal" mode operation, the gating circuit 201 will allow the response or capture data from the flip-flops 107$_N$ and 107$_{N-1}$ to propagate to the multiplexer 101 throughout the remaining duration of the capture pulse. Thus, if the response data captured in the flip-flops 107$_N$ and 107$_{N-1}$ have identical logic levels (e.g., the zeros indicated in FIG. 5), the gating circuit 201 propagates non-mutually exclusive select signals to the multiplexer 101, which can damage the multiplexer 101 as described above. Consequently, in this conventional scheme, the ATPG software tool must still be constrained to avoid generating test patterns causing the circuit 200 (FIG. 2) from generating response or capture data that provide non-mutually exclusive select signals to the multiplexer 101 (and any other circuit device in the circuit 200 that requires mutually exclusive signals). Accordingly, there is a need for a circuit that avoids the "response data constraint" on the ATPG tool in generating test patterns.

SUMMARY

In accordance with the present invention, a mutual exclusivity circuit is provided for ensuring mutual exclusivity of selected signals in applying test patterns during scan testing. In one embodiment, the mutual exclusivity circuit includes a logic gate, a delay gate, a first storage element and a second storage element. The mutual exclusivity circuit is advantageously used to receive the rst_tri_en signal (FIG. 2) and provide a local_rst_tri_en signal instead of the conventional rst_tri_en signal to the conventional gating circuit (FIG. 2).

In this particular embodiment, the logic gate is an AND-gate, the delay gate is an inverter, and the two storage elements are scan flip-flops. The first flip-flop has a data input lead connected to receive a logic low level signal and has a scan input lead connected to receive a logic high level. The first flip-flop has an output lead connected to a data input lead of the second flip-flop. The scan-input lead of the second flip-flop is connected to receive a logic low level signal. The output signal generated by the second flip-flop is inverted by the inverter and provided to the AND-gate. The AND-gate is also connected to receive the rst_tri_en signal and output a local_rst_tri_en signal to a conventional gating circuit (e.g., gating circuit 201 in FIG. 2).

During the scan mode, the second flip-flop stores the logic low level received at its scan input lead, which is then inverted and received by the AND-gate. However, the AND-gate outputs the local_rst_tri_en signal at a logic low level because the rst_tri_en signal (described above) is at a logic low level during the scan mode. Thus, the gating circuit operates as in a conventional circuit, outputting mutually exclusive signals. It will be appreciated that during the scan mode, the first flip-flop outputs a logic high level to the data input lead of the second flip-flop.

Prior to the leading edge of the capture pulse, the rst_tri_en signal transitions to a logic high level, to enable the shifted test pattern to propagate through the circuit under test. This transition of the rst$_{13}$tri_en signal also causes the local_rst$_{13}$tri_en signal to transition to a logic high level. However, at the capture edge, after a short propagation delay through the second flip-flop, the inverter and the AND-gate, the logic high output signal of the second flip-flop causes the local_rst$_{13}$tri_en signal to transition to a logic low level. The logic low level of the local_rst_tri_en signal causes the gating circuit to output mutually exclusive signals as described above in conjunction with FIGS. 3 and 4. This short propagation delay is predetermined to be sufficient in duration to allow the scan chain flip-flops to properly capture the response data, but short enough in duration to avoid damaging the circuit device receiving response signals from the scan chain if the signals are not mutually exclusive. Accordingly, the ATPG software tool can be allowed to generate test patterns that result in non-mutually exclusive response data, thereby significantly reducing the complexity, processing time and costs of generating test patterns.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
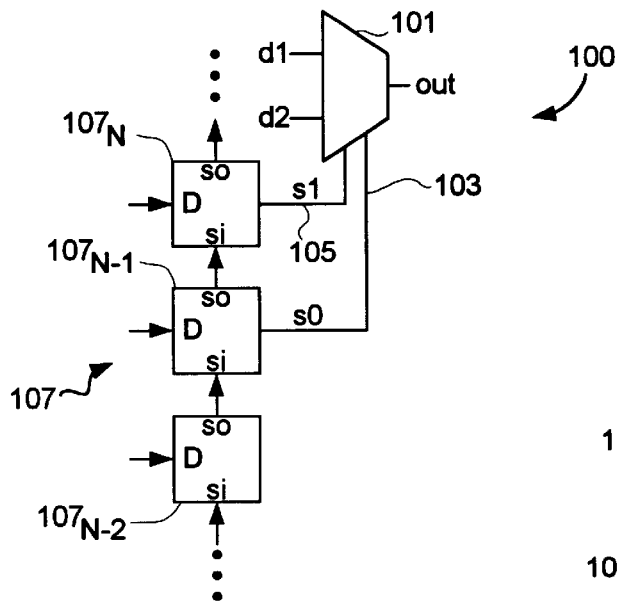
FIG. 1 is a block diagram of a portion of a conventional scan architecture circuit with a circuit device requiring mutually exclusive signals.
Figure 2:
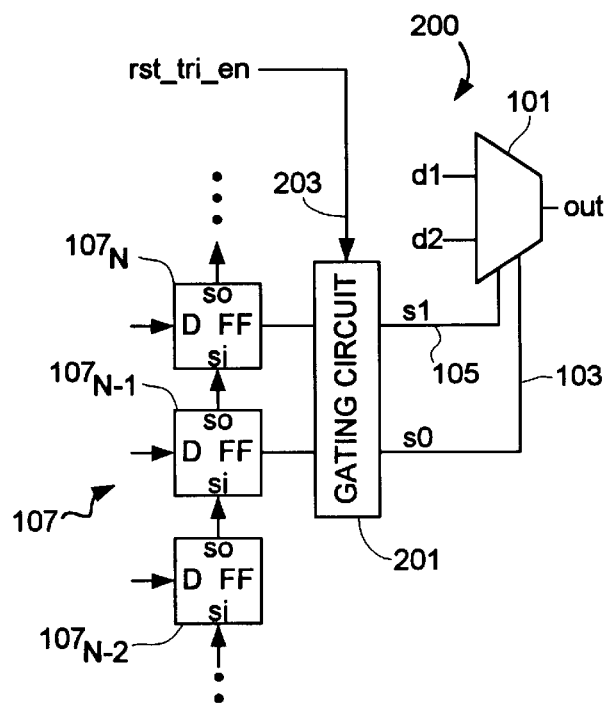
FIG. 2 is a block diagram of a portion of a conventional scan architecture circuit with a conventional gating circuit.
Figure 6:
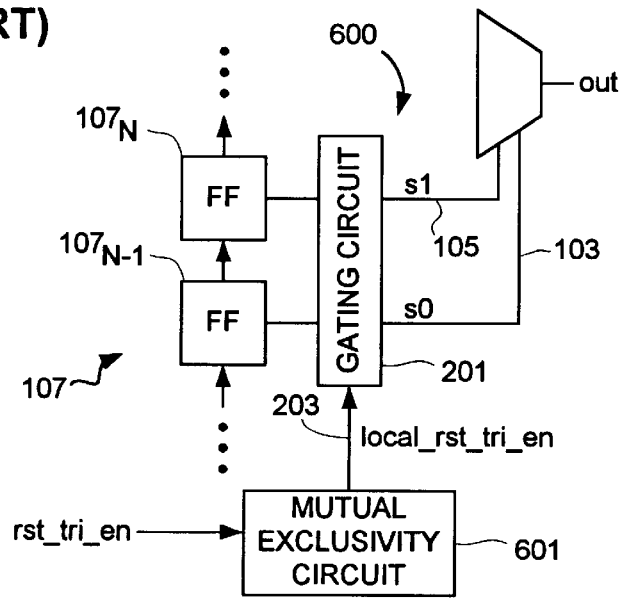
FIG. 6 is a block diagram of a portion of a scan architecture circuit having a mutual exclusivity circuit according to one embodiment of the present invention.

FIG. 6 is a block diagram of a portion of a scan architecture circuit 600 including a mutual exclusivity circuit 601 according to one embodiment of the present invention. The circuit 600 is substantially similar to the circuit 200 (FIG. 2) except that the circuit 600 includes a mutual exclusivity circuit 601 connected to the gating circuit 201. It is understood by those skilled in the art of test circuits that the circuit 600 includes a substantially similar mutual exclusivity circuit for every circuit device having mutual exclusivity requirements (e.g., three-state bus buffers, decoded multiplexers). It will be understood by those skilled in the art of test circuits that the term "mutual exclusivity requirement" refers to the requirement of a circuit device that receives a set of two or more signals of which only one signal of the set can be asserted at any time. This requirement is sometimes referred to as a "one-hot" requirement. The methodology of the present invention is described in the commonly-assigned and co-filed U.S. Patent Application Serial No. [Attorney Docket No. P182111] by the present inventor, which is incorporated herein by reference in its entirety.

Figure 4:
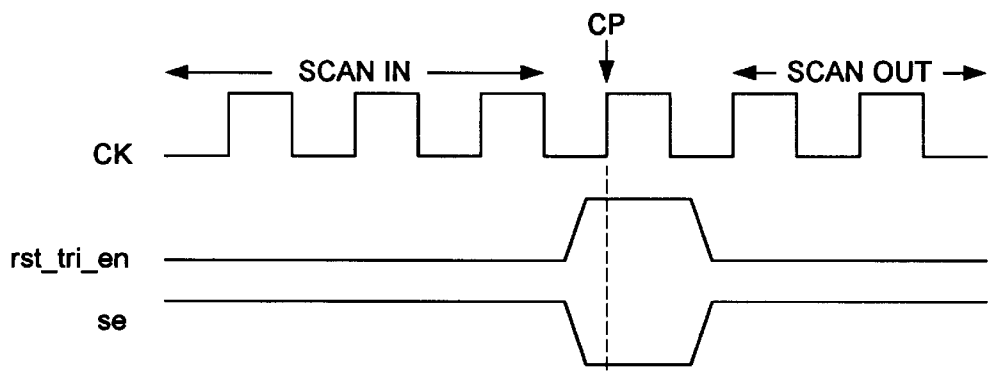
FIG. 4 is a timing diagram illustrative of the operation of the portion of the conventional scan architecture circuit depicted in FIG. 2.
Figure 5:
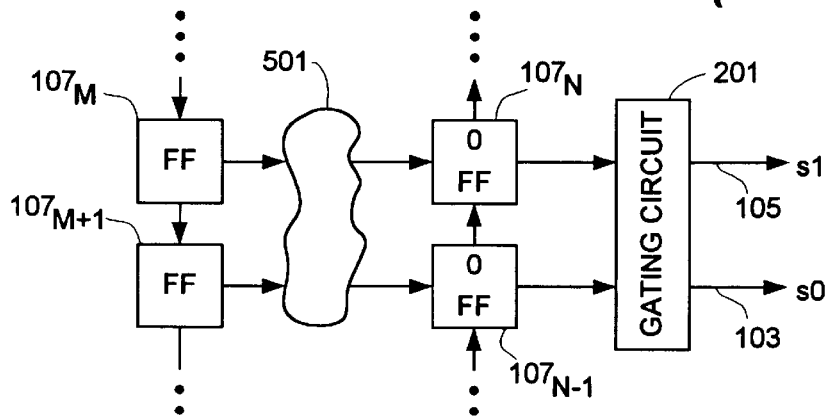
FIG. 5 is a block diagram of a portion of the conventional scan architecture circuit illustrative of non-mutually exclusive response data.

The mutual exclusivity circuit 601 is advantageously used to receive the rst_tri_en signal and provide a local_rst$_{13}$ tri_en signal (via the line lead 203) instead of the rst$_{13}$ tri_en signal to the conventional gating circuit 201. During the scan mode, the local_rst_tri_en signal is substantially identical to the rst$_{13}$ tri_en signal. However, at the leading edge of the capture pulse (see FIG. 4), whereas the rst_tri_ en signal transitions to a logic high level for about an entire clock cycle, the local_rst$_{13}$ tri_en signal transitions to a logic high level for a relatively short duration sufficient long so that the response data may be captured in the scan chain 107. In addition, the duration of the local_rst$_{13}$ tri_en "pulse" is short enough to avoid damage to the multiplexer 101 and any other circuit device requiring mutually exclusive signals that can be propagated from the scan chain 107 if these signals are not mutually exclusive. The typical duration would vary based on the circuit, design of the multiplexer, delays in the circuit and the technology used to implement the multiplexer. Accordingly, the ATPG software tool can be allowed to generate test patterns that result in non-mutually exclusive response data, thereby significantly reducing the complexity, processing time and costs of generating test patterns.

Figure 7:
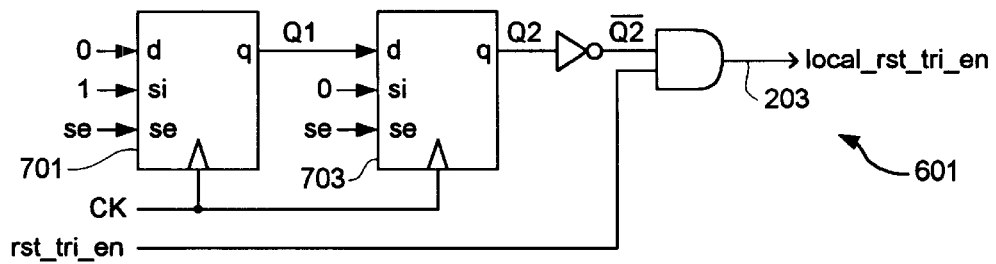
FIG. 7 is a circuit diagram of one embodiment of a mutual exclusivity circuit according to the present invention.

FIG. 7 is a circuit diagram of one embodiment of the mutual exclusivity circuit 601 (FIG. 6) according to the present invention. In this embodiment, the mutual exclusivity circuit 601 includes a first scan flip-flop 701, a second scan flip-flop 703, an inverter 705 and a two-input AND-gate 707. The first flip-flop 701 has a data input lead connected to receive a logic low level signal and has a scan-input lead connected to receive a logic high level signal. The second flip-flop 703 has a data input lead connected to the q (non-inverting) output lead of the first flip-flop 701 and has a scan-input lead connected to receive a logic low level signal. The scan flip-flops 701 and 703 are conventional scan flip-flops and, thus, are connected to receive a scan enable signal se and a clock signal CK. The inverter 705 is connected between the q output lead of the second flip-flop 703 and an input lead of the AND-gate 707. The other input lead of the AND-gate 707 is connected to receive the rst$_{13}$ tri_en signal. The output lead of the AND-gate 707 is coupled to the gating circuit 201 (FIG. 6) through the line 203. It will be appreciated that the flip-flops 701 and 703 are not part of the scan chain 107 (FIG. 6).

Figure 8:
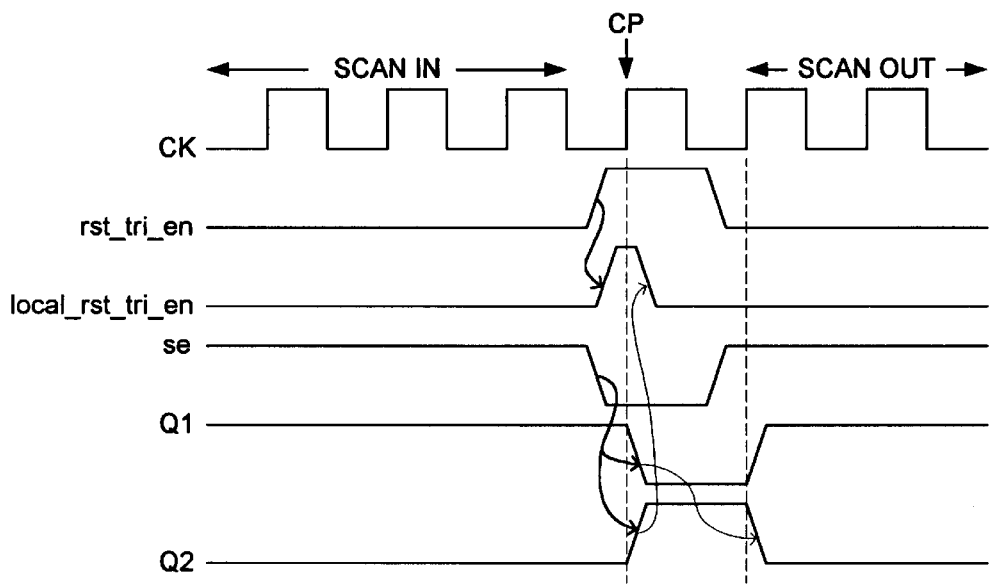
FIG. 8 is a timing diagram illustrative of the operation of the portion of the scan architecture circuit depicted in FIG. 6 using the mutual exclusivity circuit depicted in FIG. 7.

FIG. 8 is a timing diagram illustrative of the operation of the mutual exclusivity circuit 601 (FIG. 7). Referring to FIGS. 7 and 8, the mutual exclusivity circuit 601 operates as follows. To scan in the test pattern, the scan enable signal se is asserted and the rst_tri_en signal is deasserted, placing the circuit 600 (FIG. 6) in the scan mode. Thus, during the scan mode, the AND-gate 707 outputs the local_rst_tri_en signal at a logic low level because the rst_tri_en signal is at a logic low level. Thus, the gating circuit operates as in a conventional circuit, outputting mutually exclusive signals.

Also during the scan mode, the second flip-flop 703 stores the logic low level received at its scan-input lead. Thus, the second flip-flop 703 outputs a signal Q2 with a logic low level to the inverter 705, which provides the complement of the signal Q2 to the AND-gate 707. In this embodiment, the signal received at the scan-input lead of the second flip-flop 703 is provided by hardwiring the scan-input lead to a ground line. Similarly, the first flip-flop 701 stores and outputs the hardwired logic high level signal received at the scan-input lead of the first flip-flop 701. Consequently, during the scan mode, the first flip-flop 701 outputs a signal Q1 with logic low level to the data input lead of the second flip-flop 703.

Just prior to the leading edge of the capture pulse CP, the rst_tri_en signal transitions to a logic high level and the scan enable signal se transitions to a logic low level. Thus, the circuit 600 is configured in the normal mode. As a result of the logic high level of the rst_tri_en signal received by the AND-gate 707, the local_rst$_{13}$ tri_en signal also transitions to a logic high level, which causes the gating circuit 201 to output the data from the scan chain 107, as in a conventional circuit.

In addition, at the leading edge of the capture pulse CP, the logic low level of the scan enable signal se causes the first and second flip-flops 701 and 703 to store the logic levels of the signals received at their respective data input leads. Thus, at the leading edge of the capture pulse CP, the flip-flops 701 and 703 generate the signals Q1 and Q2 with logic low and logic high levels, respectively.

Figure 3:
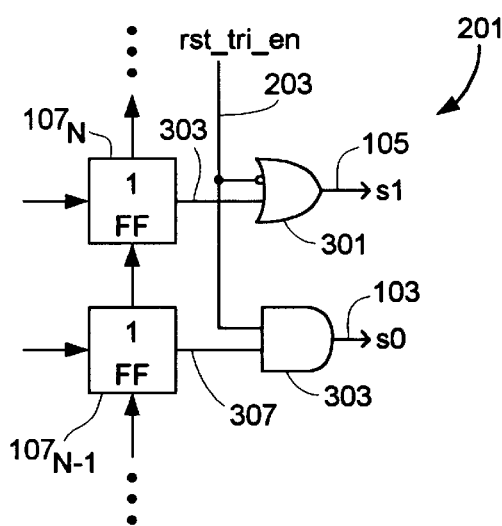
FIG. 3 is a circuit diagram of the conventional gating circuit depicted in FIG. 2.

After a short propagation delay through the inverter 705, the logic high level of the signal Q2 of the second flip-flop 703 is inverted. This transition of the signal Q2 causes the local_rst_tri_en signal generated by the AND-gate 707 to transition to a logic low level, thereby creating a relatively short duration local_$rst_{13}$ tri_en "pulse". The logic low level of the local_rst_tri_en signal causes the gating circuit 201 to operate as if the circuit 600 (FIG. 6) is in the scan mode. More specifically, the logic low level of the local_$rst_{13}$ tri_en signal causes the gating circuit 201 to output mutually exclusive signals at the leads 103 and 105 as described above in conjunction with FIGS. 3 and 4. The short propagation delay from the second flip-flop 703, the inverter 705 and the AND-gate 707 is predetermined so that the duration of the local_$rst_{13}$ tri_en "pulse" is sufficient to allow the flip-flops of the scan chain 107 to properly store the response data. In addition, the local_$rst_{13}$ tri_en "pulse" is predetermined to be short enough in duration to avoid damaging the multiplexer 101 (FIG. 6) receiving the response signals from the flip-flops 107$_N$ and 107$_{N-1}$ if these response signals are not mutually exclusive. In this embodiment, the predetermined time period is about 500 picoseconds, but can be in the range of 0.4–2 nanoseconds, depending on the delays, clock skews and hold time requirements of the scan chain flip-flops and other circuit-based parameters (in addition to the design and tolerance of the multiplexer 101 to mutual exclusivity violations as described above). Accordingly, the ATPG software tool can be allowed to generate test patterns that result in non-mutually exclusive response data, thereby significantly reducing the complexity, processing time and costs of generating test patterns. The mutual exclusivity circuit 601 provides control of the $rst_{13}$ tri_en signal locally at the circuit device requiring the mutually exclusive signals, thereby helping to ensure that the timing requirements are met for capturing the response data while avoiding damage to the circuit device.

Figure 9:
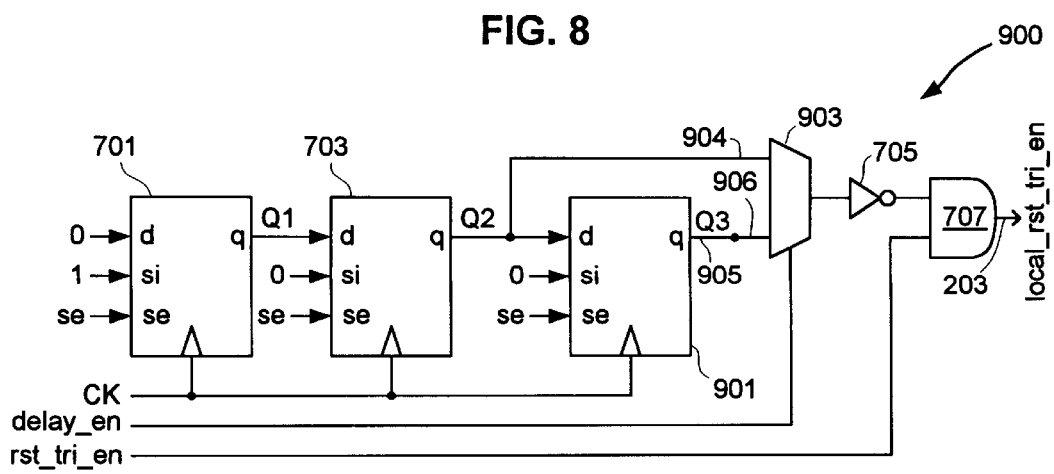
FIG. 9 is a circuit diagram of a second embodiment of a mutual exclusivity circuit for use in delay testing, according to the present invention.

FIG. 9 is a circuit diagram of an exclusivity circuit 900 for use in delay testing, according to another embodiment the present invention. As is well known in the art of test circuits, delay testing is a form of scan test in which the circuit under test is allowed to operate in the normal mode for two or more clock cycles after the test pattern is scanned in. This embodiment of the mutual exclusivity circuit 900 is selectively configured into either a normal scan test or a two capture edge delay test.

The exclusivity circuit 900 is substantially similar to the exclusivity circuit 601 (FIG. 7), except that the exclusivity circuit 900 includes a third flip-flop 901 and a two-input multiplexer 903. In particular, the q output lead of the second flip-flop 703 is connected to the input lead 904 of the multiplexer 903. The q output lead of the second flip-flop 703 is also connected to the data input lead of the third flip-flop 901. The q output lead 905 of the third flip-flop 901 is connected to the other input lead 906 of the multiplexer 903. The output lead of the multiplexer 903 is connected to the input lead of the inverter 705. The multiplexer 903 is connected to receive a delay_en signal from the conventional TAP controller or Reset controller (not shown). The delay_en signal is well known to those skilled in the art of test circuits. Otherwise, the mutual exclusivity circuit 900 is interconnected as described above in conjunction with FIG. 7 for the mutual exclusivity circuit 601.

When the delay_en signal is deasserted (i.e., at a logic low level), the mutual exclusivity circuit 900 is configured in the normal scan test mode. The logic low level of the delay_en signal causes the multiplexer 903 to output to the inverter 705 the Q2 signal received from the second flip-flop 703. Thus, the mutual exclusivity circuit 900 in effect bypasses the third flip-flop 901 and operates as described above in conjunction with FIGS. 7 and 8.

In contrast, when the delay_en signal is asserted, the mutual exclusivity circuit 900 is configured in the delay test mode. In the delay test mode, the $rst_{13}$ tri_en signal is asserted for two clock cycles (instead of one as in the normal scan mode) to allow the circuit under test to receive two consecutive capture edges for this embodiment of the delay testing scheme. Similarly, the scan enable signal se is deasserted for two clock cycles. The logic high level of the delay_en signal causes the multiplexer 903 to output to the inverter 705 the output signal Q3 from the q output lead of the third flip-flop 901. Thus, the logic high level (from the q output lead) of the first flip-flop 701 requires two clock edges to be propagated to the inverter 705. After a short propagation delay, the inverter 705 inverts this logic high level from the third flip-flop 901 and thus provides a logic low level to the AND-gate 707. The AND-gate 707 then causes the local_rst_tri_en signal to transition to a logic low level. As described above in conjunction with FIG. 6, the gating circuit 201 then causes the select signals s0 and s1 to be mutually exclusive after a predetermined time period from the leading edge of the local_$rst_{13}$ tri_en "pulse" (i.e., the gating circuit causes the select signals to be mutually exclusive at the falling edge of the local_$rst_{13}$ tri_en signal). This predetermined time period is sufficient to capture the response data without damaging the circuit device requiring mutually exclusive signals. As in conventional circuits, the ATPG software tool must be constrained to generate test patterns for the first capture edge of delay tests that meet mutual exclusivity requirements. However, no such constraints are needed for the second capture edge. Thus, the complexity, processing time and costs for generating test patterns for delay tests can also be significantly reduced.

The embodiments of the mutual exclusivity circuit described above are illustrative of the principles of this invention and are not intended to limit the invention to the particular embodiments described. For example, other embodiments may be adapted for circuit devices having a mutual exclusivity (or one-hot) requirement for a set of three or more signals. In light of this disclosure, those skilled in the art of test circuit design can implement different embodiments of the mutual exclusivity circuit without undue experimentation. In addition, using this disclosure, those skilled in the art of test circuit design can implement without undue experimentation other embodiments adapted for scan testing schemes with separate scan clock signals. Accordingly, while a preferred embodiment of the invention has been illustrated and described, it will be appreciated that in view of this disclosure, various changes can be made therein without departing from the spirit and scope of the invention.

The embodiments of the invention in which an exclusive property or privilege is claimed are defined as follows:

1. A circuit for ensuring mutual exclusivity of selected signals in scan architecture circuitry, the circuit being coupled to a gating circuit that is connected to receive the selected signals, the circuit comprising:

a first storage element having an output lead, a data input lead and a scan-input lead, said data input lead of said first storage element being coupled to receive a signal having a first logic level, said scan-input lead of said first storage element coupled to receive a signal having a second logic level;

a second storage element having an output lead, a data input lead and a scan-input lead, said data input lead of said second storage element being coupled to said output lead of said first storage element, said scan-input lead of said second storage element coupled to receive a signal having a logic level equivalent to said first logic level;

an delay circuit having an input lead coupled to said output lead of said second storage element; and a logic gate having a first input lead, a second input lead and an output lead, said first input lead being coupled to an output lead of said delay circuit, said second input lead being coupled to receive a control signal, and said output lead of said logic gate being coupled to the gating circuit.

2. The circuit of claim 1 wherein said first and second storage elements each comprise a flip-flop.

3. The circuit of claim 1 wherein said delay circuit comprises an inverter.

4. The circuit of claim 1 wherein said logic gate comprises an AND-gate.

5. The circuit of claim 1 wherein said logic gate is configured to provide a local control signal to the gating circuit, the local control signal operative to cause the gating circuit to output mutually exclusive signals during a first mode and to output the selected signals during a second mode.

6. The circuit of claim 5 wherein said local control signal is operative to cause the gating circuit to output mutually exclusive signals after a predetermined time period after a leading edge of a capture pulse, said predetermined time period being less than a cycle time of a clock cycle of a clock signal received by said circuit.

7. The circuit of claim 6 wherein said predetermined time period has a sufficient duration to allow response data to be captured in the scan architecture circuitry.

8. The circuit of claim 7 wherein said predetermined time period has a duration less than a maximum time period of a circuit device coupled to receive the selected signals from the gating circuit, said maximum time period being equivalent to a duration that the circuit device can receive non-mutually exclusive signals without damage.

9. The circuit of claim 8 wherein said predetermined time period is about 0.4 to 2.0 nanoseconds.

10. The circuit of claim 1 wherein the selected signals serve as control signals received by a decoded multiplexer of the scan architecture circuitry.

11. The circuit of claim 1 wherein the selected signals are received by a set of corresponding three state buffers driving a single conductive line.

12. The circuit of claim 1 further comprising:

a third storage element having a data input lead, a scan-input lead and an output lead, said scan-input lead of said third storage element being coupled to receive a signal having a logic level equivalent to said first logic level, said data input lead coupled to said output lead of said second storage element; and a multiplexer configured to selectively couple said output lead of said second storage element to said input lead of said delay circuit, and to configured to selectively couple said output lead of said third storage element to said input lead of said delay circuit.

13. The circuit of claim 12 wherein said multiplexer is coupled to receive a second control signal, said multiplexer being configured to couple either said output lead of said second storage element or said output lead of said third storage element to said input lead of said delay circuit in response to a logic level of said second control signal.

14. The circuit of claim 13 wherein said second control signal is asserted during a delay test, causing said multiplexer to couple said output lead of said third storage element to said input lead of said delay circuit.

15. The circuit of claim 1 wherein said first control signal is deasserted when during a scan mode and asserted during a normal mode.

* * * * *